United States Patent
Kong et al.

(10) Patent No.: US 12,140,505 B2
(45) Date of Patent: Nov. 12, 2024

(54) WAFER PROCESSING APPARATUS AND CONTROL METHOD THEREOF

(71) Applicant: ZEUS CO., LTD., Hwaseong-si (KR)

(72) Inventors: Woon Kong, Cheonan-si (KR); Ji Hoon Song, Cheonan-si (KR); Ji Ho Park, Hwaseong-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 390 days.

(21) Appl. No.: 17/407,699

(22) Filed: Aug. 20, 2021

(65) Prior Publication Data
US 2022/0065730 A1  Mar. 3, 2022

(30) Foreign Application Priority Data
Aug. 25, 2020 (KR) .......................... 10-2020-0106761

(51) Int. Cl.
*G01M 3/28* (2006.01)
*H01L 21/67* (2006.01)
*H01L 21/683* (2006.01)
*H01L 21/687* (2006.01)

(52) U.S. Cl.
CPC ..... *G01M 3/2869* (2013.01); *H01L 21/67017* (2013.01); *H01L 21/6838* (2013.01); *H01L 21/68721* (2013.01)

(58) Field of Classification Search
CPC .... G01M 3/26; G01M 3/2869; G01M 3/3209; G01M 3/3254; G01M 3/3263; G01M 3/3272; H01L 21/67017; H01L 21/6838; H01L 21/68721
See application file for complete search history.

(56) References Cited

U.S. PATENT DOCUMENTS

| | | | | |
|---|---|---|---|---|
| 6,139,712 A | * | 10/2000 | Patton | C25D 7/123 205/137 |
| 6,248,222 B1 | * | 6/2001 | Wang | C25F 7/00 204/297.09 |
| 2002/0132559 A1 | * | 9/2002 | Togawa | B24B 49/16 451/21 |
| 2004/0104120 A1 | * | 6/2004 | Wang | H01L 21/6723 204/198 |

FOREIGN PATENT DOCUMENTS

| | | |
|---|---|---|
| JP | 2005-191368 | 7/2005 |
| KR | 10-1999-029905 | 4/1999 |
| KR | 20-0244647 | 10/2001 |
| KR | 10-2016-0122067 | 10/2016 |
| TW | 201613026 | 4/2016 |

* cited by examiner

*Primary Examiner* — Paul M. West
(74) *Attorney, Agent, or Firm* — KILE PARK REED & HOUTTEMAN PLLC

(57) ABSTRACT

A wafer processing apparatus includes a vacuum chuck on which a wafer is seated, a ring cover installed on a circumferential portion of the vacuum chuck, a medium supply part connected to the vacuum chuck to supply an inspection medium to the vacuum chuck, and a sealing ring which is installed in the vacuum chuck to support the wafer and into which the inspection medium supplied to the vacuum chuck is introduced.

20 Claims, 19 Drawing Sheets

WAFER PROCESSING APPARATUS AND CONTROL METHOD THEREOF

CROSS-REFERENCE TO RELATED APPLICATION

This application claims the benefit under 35 U.S.C. § 119(a) of Korean Patent Application No. 10-2020-0106761 filed on Aug. 25, 2020 in the Korean Intellectual Property Office, the entire disclosure of which is incorporated herein by reference for all purposes.

BACKGROUND

Field of the Invention

The present invention relates to a wafer processing apparatus and a control method thereof, and more particularly, to a wafer processing apparatus and a control method thereof through which whether a sealing ring is damaged or contaminated is easily and quickly checkable.

Discussion of Related Art

Generally, in a semiconductor process, an etching process of etching a wafer, a singulation process of cutting the wafer into a plurality of dies, and a cleaning process of cleaning the wafer are performed. A wafer processing apparatus is used in an etching process or a cleaning process of a wafer.

The wafer processing apparatus includes a rotating table that is rotatably installed and has an upper portion on which the wafer is seated, and a sealing ring coupled to an edge of the rotating table in the form of a ring. In a state in which the rotating table is rotated, a treatment solution is supplied onto the wafer seated on the rotating table.

However, since it is difficult for the existing wafer processing apparatus to accurately determine whether the sealing ring is damaged, the sealing ring is periodically replaced. Accordingly, a maintenance cost of the wafer processing apparatus can be increased.

In addition, a process of coupling the sealing ring to the upper portion of the rotating table is cumbersome, and during the coupling process, a coupling completion state of the sealing ring is not uniform, and thus coupling errors (misalignment and the like) can occur. Furthermore, when a coupling error of the sealing ring occurs, since the treatment solution infiltrates into an outer side of the sealing ring, a structure in a circumferential portion of the rotating table can be damaged.

In addition, in order to prevent a position of the wafer from varying, a wafer fixing module is installed and a sealing ring fixing module for fixing the sealing ring is installed. Accordingly, a structure of the wafer processing apparatus can be complicated, and a manufacturing cost can be increased.

The background art of the present invention is disclosed in Korean Patent Laid-Open Application No. 10-2016-0122067 (published on Oct. 21, 2016, entitled "Wafer Treating Device and Sealing Ring for A Wafer Treating Device").

SUMMARY OF THE INVENTION

The present invention is directed to a wafer processing apparatus and a control method thereof through which whether a sealing ring is damaged or contaminated is easily and quickly checkable.

According to an aspect of the present invention, there is provided a wafer processing apparatus including a vacuum chuck on which a wafer is seated, a ring cover installed on a circumferential portion of the vacuum chuck, a medium supply part connected to the vacuum chuck to supply an inspection medium to the vacuum chuck, and a sealing ring which is installed in the vacuum chuck to support the wafer and into which the inspection medium supplied to the vacuum chuck is introduced.

The vacuum chuck may include a vacuum chamber formed to supply the inspection medium, which is supplied to the vacuum chuck, to the sealing ring.

The medium supply part may include a medium supply pipe connected to the vacuum chamber, and a valve installed on the medium supply pipe to open or close a flow path of the medium supply pipe.

The medium supply part may further include a pressure sensing part installed on a medium supply pipe to measure a pressure of the medium supply pipe, and a flow rate sensing part installed on the medium supply pipe to measure a flow rate of the inspection medium flowing in the medium supply pipe.

The inspection medium may include a fluorescent material.

The sealing ring may include a sealing member which is accommodated in a sealing groove of the vacuum chuck and in which a deformation space is formed, a confining ring installed in the sealing groove to fix the sealing member, and a connector connected to the deformation space to supply the inspection medium to the deformation space.

The sealing member may detect a pressure and a flow rate of the medium supply pipe to confirm whether the sealing member is damaged and whether the inspection medium is introduced into the sealing ring.

The sealing member may include a sealing body which is accommodated in the sealing groove and in which the deformation space is formed, and a fixing rib extending inward from the sealing body to be fitted in the confining ring.

The sealing body may include an elastic groove formed in an outer or inner surface of the sealing body.

The sealing body may include a tapered portion formed on both sides or one side of the sealing body in a width direction thereof.

The sealing body may include a concave portion which is concavely formed in an upper side of the sealing body.

The sealing body may further include an elastic groove formed in the outer or inner surface of the sealing body.

The sealing body may include a stepped portion formed on the upper side of the sealing body.

The sealing body may include a plurality of deformed grooves formed in the upper side of the sealing body.

The sealing body may include a round portion formed to be round on the both sides or the one side of the sealing body in the width direction thereof.

The sealing body may include a convex portion formed on the upper side of the sealing body.

The vacuum chuck may include a first vacuum chuck which is installed on a rotating chuck to be rotated together therewith and in which a vacuum chamber is formed, and a second vacuum chuck which is mounted on the first vacuum chuck, in which the sealing ring is installed, and which is installed to be moved by a moving module.

The wafer processing apparatus may further include a chuck module installed in the rotating chuck and configured to fix the wafer to the vacuum chuck and fix the ring cover to the rotating chuck.

The chuck module may further include a chuck base installed in the rotating chuck, a chuck rotating part connected to the chuck base to rotate the chuck base, a plurality of first chuck links, each of which is radially connected to the chuck base and moved when the chuck base is rotated, a plurality of wafer confining parts, each of which is connected to one of the first chuck links to fix a retainer ring on the wafer to the vacuum chuck when the first chuck links are moved, a plurality of second chuck links radially connected to the chuck base and moved when the chuck base is rotated, and a plurality of cover confining parts connected to the second chuck links to fix the ring cover to the rotating chuck when the second chuck links are moved.

When the chuck base is rotated, the plurality of first chuck links and the plurality of second chuck links may be moved simultaneously.

According to another aspect of the present invention, there is provided a control method of a wafer processing apparatus which includes supplying an inspection medium to a sealing ring as a medium supply part is driven, detecting whether the inspection medium leaks from the sealing ring, and determining whether the sealing ring is damaged by whether the inspection medium leaks.

In the detecting of whether the inspection medium leaks from the sealing ring, a pressure sensing part may measure a pressure of the inspection medium supplied to the sealing ring.

In the detecting of whether the inspection medium leaks from the sealing ring, a flow rate sensing part may measure a flow rate of the inspection medium supplied to the sealing ring.

BRIEF DESCRIPTION OF THE DRAWINGS

The above and other objects, features and advantages of the present invention will become more apparent to those skilled in the art by describing exemplary embodiments thereof in detail with reference to the accompanying drawings, in which.

DETAILED DESCRIPTION OF EXEMPLARY EMBODIMENTS

Figure 1:
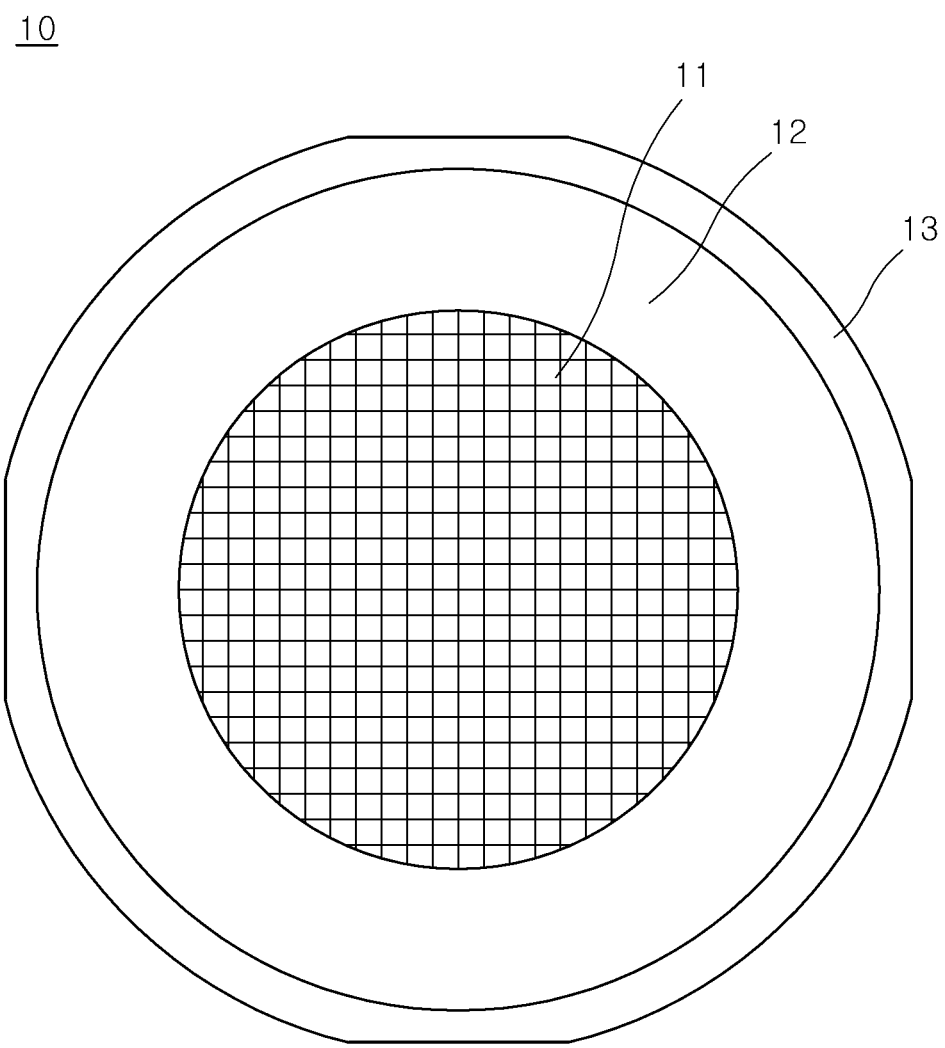
FIG. 1 is a schematic plan view illustrating a wafer processed in a wafer processing apparatus according to one embodiment of the present invention.

Hereinafter, exemplary embodiments of a wafer processing apparatus and a control method thereof according to the present invention will be described with reference to the accompanying drawings. In the following description of the wafer processing apparatus and the control method thereof, thicknesses of lines and sizes of components shown in the drawings may be exaggerated for clarity and convenience of the description. In addition, the terms described below are defined in consideration of the functions in the present invention, and these terms may be varied according to the intent or custom of a user or an operator. Therefore, the definitions of the terms used herein should follow contexts disclosed herein.

Figure 2:
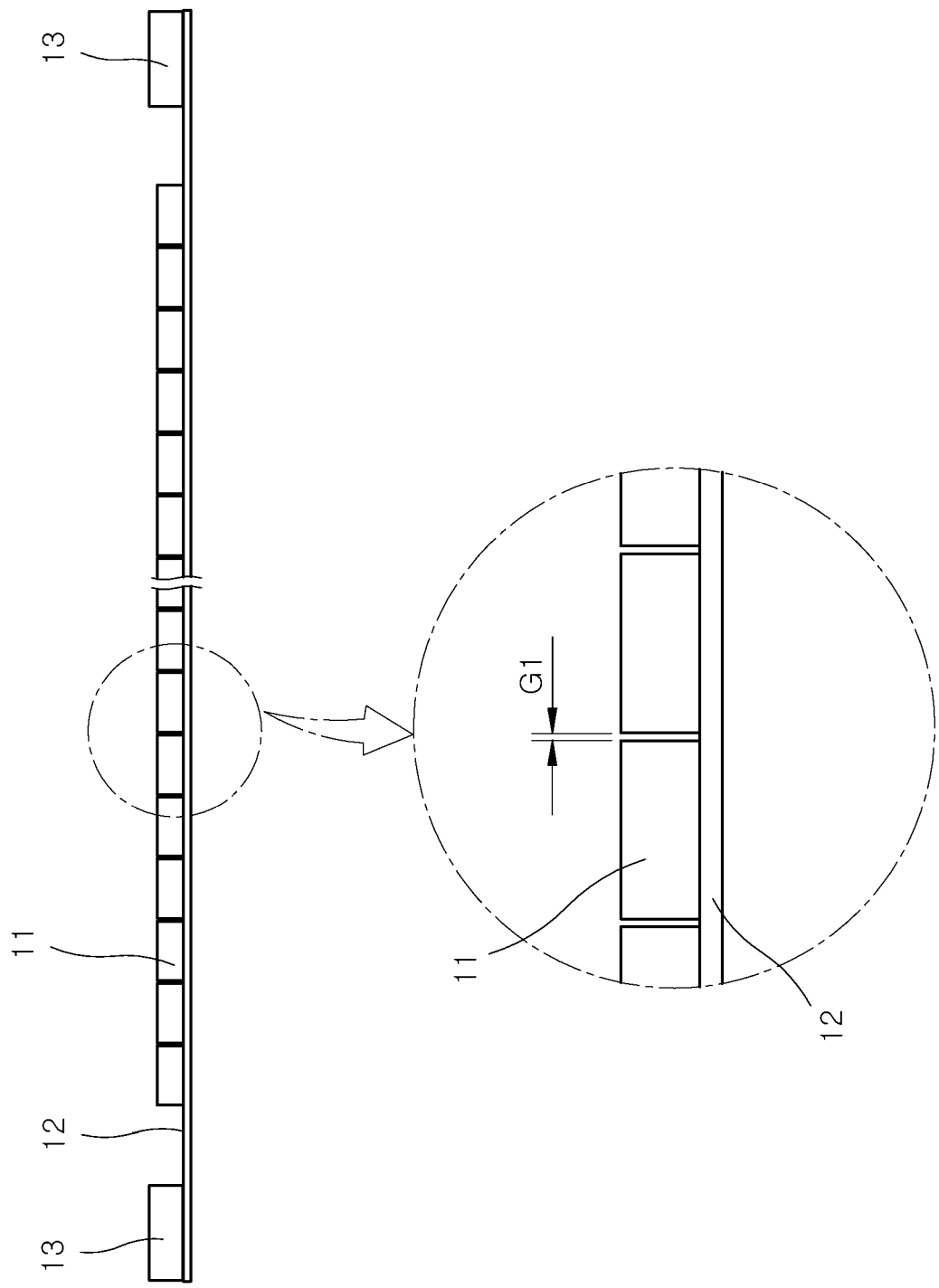
FIG. 2 is a schematic side view illustrating the wafer processed in the wafer processing apparatus according to one embodiment of the present invention.
Figure 3:
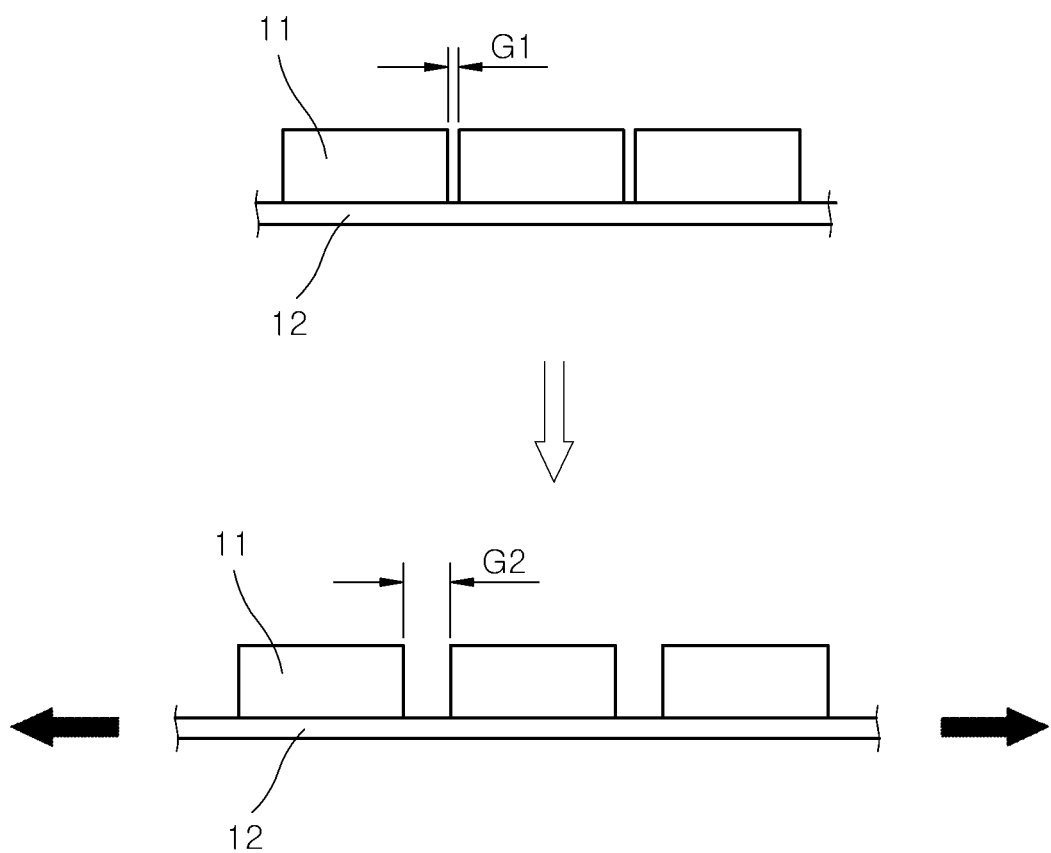
FIG. 3 is a schematic side view illustrating a state in which gaps between a plurality of dies are increased as a vacuum chuck is raised in the wafer processing apparatus according to one embodiment of the present invention.
Figure 4:
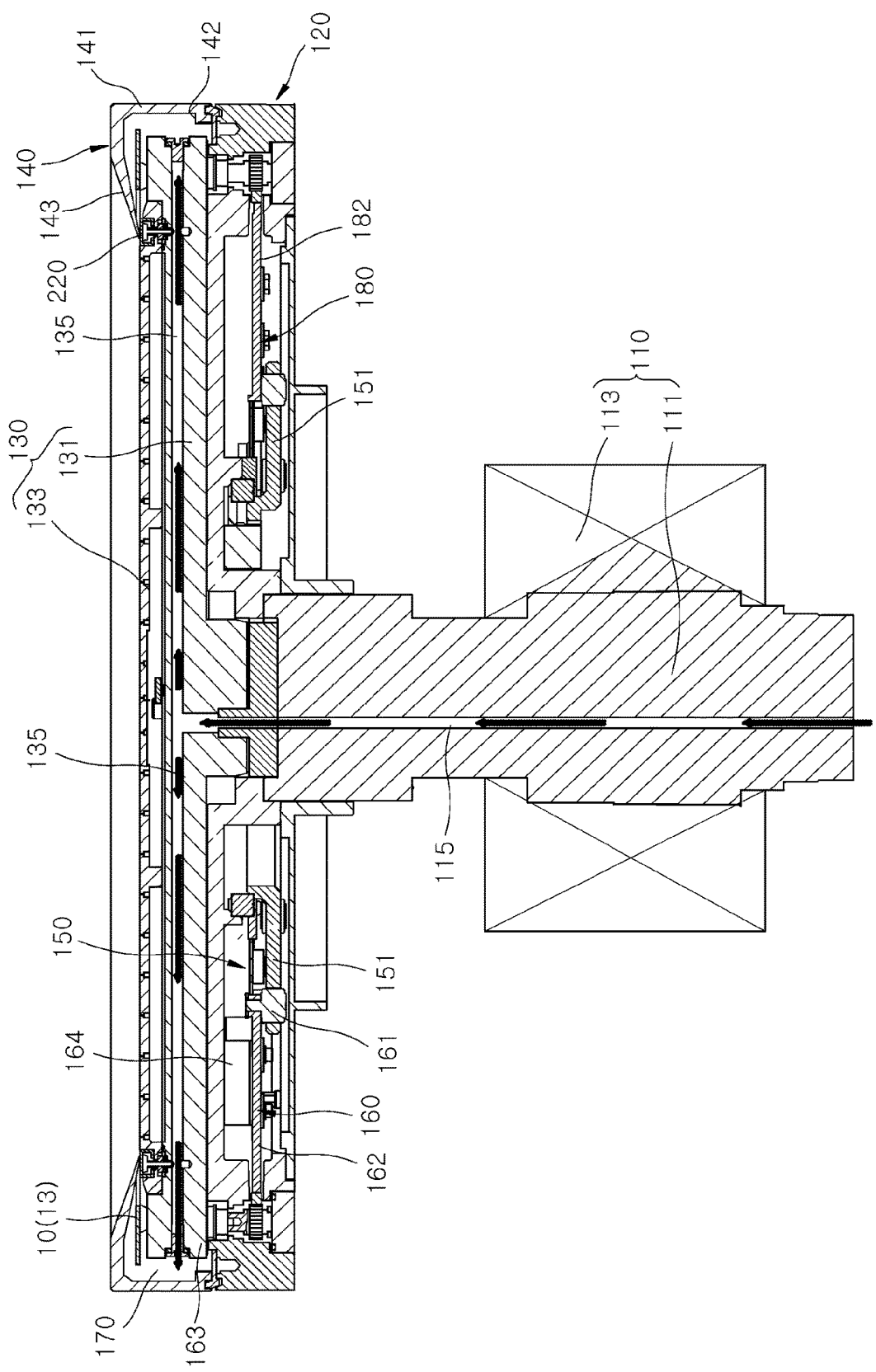
FIG. 4 is a schematic cross-sectional view illustrating the wafer processing apparatus according to one embodiment of the present invention.
Figure 5:
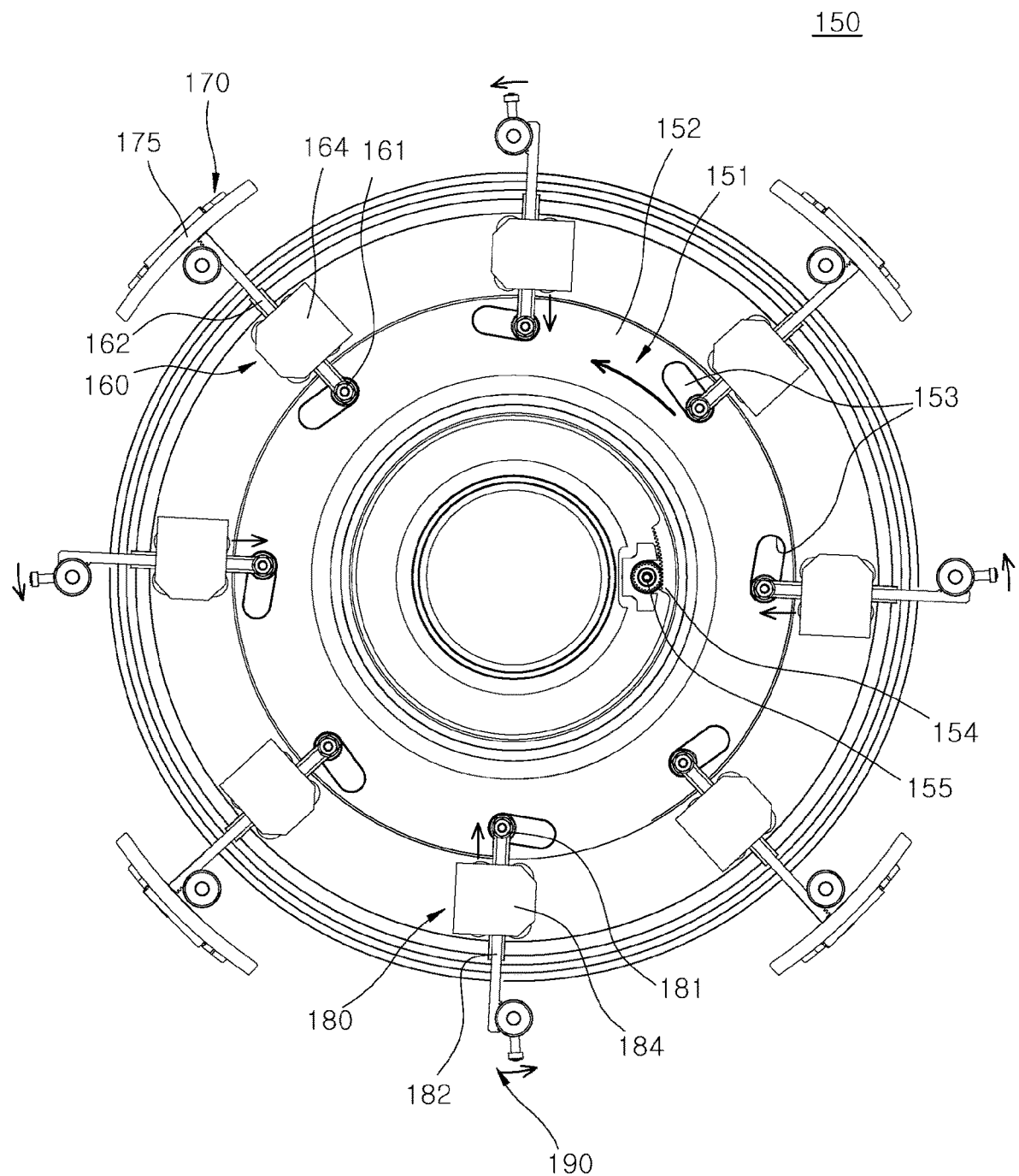
FIG. 5 is a schematic plan view illustrating a chuck module in the wafer processing apparatus according to one embodiment of the present invention.

FIG. 1 is a schematic plan view illustrating a wafer processed in a wafer processing apparatus according to one embodiment of the present invention, FIG. 2 is a schematic side view illustrating the wafer processed in the wafer processing apparatus according to one embodiment of the present invention, FIG. 3 is a schematic side view illustrating a state in which gaps between a plurality of dies are increased as a vacuum chuck is raised in the wafer processing apparatus according to one embodiment of the present invention, FIG. 4 is a schematic cross-sectional view illustrating the wafer processing apparatus according to one embodiment of the present invention, and FIG. 5 is a schematic plan view illustrating a chuck module in the wafer processing apparatus according to one embodiment of the present invention.

Referring to FIGS. 1 to 5, the wafer processing apparatus according to one embodiment of the present invention includes a vacuum chuck 130, a ring cover 140, a medium supply part 210, and a sealing ring 220.

The wafer processing apparatus etches and cleans a wafer 10. In an etching process, an etching solution is sprayed onto the wafer 10. The etched wafer 10 is cut in the form of a matrix in a singulation process so that a plurality of dies 11 are formed. In a cleaning process, a cleaning solution is sprayed onto the wafer 10, and thus foreign materials attached on the plurality of dies 11 are removed. Various types of solutions such as deionized water (DI-water) and the like may be applied as the cleaning solution. In the following description, the etching solution and the cleaning solution are collectively referred to as treatment solutions.

The wafer 10 includes the plurality of dies 11 disposed in the form of a matrix, an adhesive sheet 12 on which the plurality of dies 11 are attached, and a retainer ring 13 connected to a circumferential portion of the adhesive sheet 12 to tightly support the adhesive sheet 12 (see FIGS. 1 and 2). The adhesive sheet 12 is made of a material which is stretchable in a transverse direction. The adhesive sheet 12 is tightly pulled by the retainer ring 13, and thus the plurality of dies 11 are fixed in position and the thin-plate type die 11 maintains the form of a flat plate.

The rotating chuck 120 is rotatably installed on a driver 110 (see FIG. 4). The entirety of the rotating chuck 120 may be formed in the form of a circular plate.

The driver 110 includes a rotating shaft 111 connected to a rotation center of the rotating chuck 120, and a motor 113 installed on the rotating shaft 111. The motor 113 includes a stator (not shown) installed inside a housing (not shown), and a rotor (not shown) disposed inside the stator and installed to surround the rotating shaft 111. In addition, a belt driving scheme for rotating the rotating shaft 111 through a belt or a chain driving scheme for rotating the rotating shaft 111 through a chain may be applied to the driver 110. Various types of driving schemes may be applied to the driver 110 as long as the driving schemes can rotate the rotating chuck 120.

A vacuum flow path 115 (see FIG. 5) is formed in the rotating shaft 111 to vacuum the vacuum chuck 130. The vacuum flow path 115 is formed in a lengthwise direction of the rotating shaft 111. A vacuum chamber 135 is formed in the vacuum chuck 130 to be connected to the vacuum flow path 115.

The vacuum chuck 130 is seated on the rotating chuck 120. The wafer 10 is mounted on the vacuum chuck 130. The entirety of the vacuum chuck 130 is formed in the form of a circular plate to be seated on an upper portion of the rotating chuck 120. When the driver 110 is driven, the vacuum chuck 130 is rotated together with the rotating chuck 120. When an etching process is performed in the wafer processing apparatus, the wafer 10 in which the plurality of dies 11 are not cut is seated on the vacuum chuck 130. When a cleaning process is performed in the wafer processing apparatus, the wafer 10 in which the plurality of dies 11 are cut is seated on the vacuum chuck 130. When the dies 11 are cut from the wafer 10, foreign materials may remain on surfaces of the dies 11 and in gaps between the dies 11.

The vacuum chuck 130 includes a first vacuum chuck 131 and a second vacuum chuck 133. The first vacuum chuck 131 is installed in the rotating chuck 120 to be rotated together with the rotating chuck 120, and a vacuum chamber 135 is formed in the rotating chuck 120. The first vacuum chuck 131 generates a vacuum pressure to suction the wafer 10. The second vacuum chuck 133 is mounted on the first vacuum chuck 131, the sealing ring 220 is installed on the second vacuum chuck 133, and the second vacuum chuck 133 is installed to be moved by a moving module (not shown). The entirety of each of the first vacuum chuck 131 and the second vacuum chuck 133 may be formed in the form of a circular plate.

A plurality of suction holes (not shown) communicating with the medium flow path 115 of the first vacuum chuck 131 are formed in the second vacuum chuck 133 to suction the wafer 10. The plurality of suction holes may be disposed in the form of a concentric circle in a circumferential direction of the second vacuum chuck 133. When a vacuum pressure is formed in the medium flow path 115, since the wafer 10 is pressed against an upper surface of the second vacuum chuck 133 due to a vacuum suction force of the suction holes, flatness of the wafer 10 may be maintained while the etching or cleaning process of the wafer 10 is performed in the wafer processing apparatus.

The ring cover 140 is disposed on a circumferential portion of the vacuum chuck 130. The ring cover 140 presses the adhesive sheet 12 on the wafer 10 to seal the circumferential portion of the vacuum chuck 130. The ring cover 140 is fixed to the rotating chuck 120 by a chuck module 150. Since the ring cover 140 is formed in the form of a circular ring to press the adhesive sheet 12 on the wafer 10 and seal the circumferential portion of the vacuum chuck 130, it is possible to minimize the adhesive sheet 12 being damaged due to the etching solution and prevent the rotating chuck 120 and the vacuum chuck 130 from being contaminated or damaged due to the etching solution.

The ring cover 140 includes a cover body 141 formed to surround a circumference of the vacuum chuck 130, a confining bump 142 formed to protrude inward from a lower side of the cover body 141, and a cover pressing part 143 extending inward from an upper side of the cover body 141 and pressing the adhesive sheet 12 on the wafer 10. The cover pressing part 143 is formed to press a portion of the adhesive sheet 12 spaced about 1 mm from the outermost portion of the die 11 in the adhesive sheet 12. A thickness of the cover pressing part 143 may be formed to gradually become smaller in a direction toward an end portion of the cover pressing part 143. Since the portion of the adhesive sheet 12 between the retainer ring 13 and the die 11 is sealed by the cover pressing part 143 excluding a width of about 1 mm, it is possible to minimize the adhesive sheet 12 being damaged due to the etching solution.

The moving module (not shown) moves the second vacuum chuck 133 of the vacuum chuck 130 upward, and the rotating chuck 120 and the first vacuum chuck 131 maintain a state of being fixed in position. In this case, the circumferential portion of the vacuum chuck 130 supports the adhesive sheet 12 on the wafer 10. As the moving module is driven, the second vacuum chuck 133 of the vacuum chuck 133 is moved upward and the rotating chuck 120 is not raised so that, in a state in which the retainer ring 13 on the wafer 10 is fixed in position, the adhesive sheet 12 is raised to be stretched in the radial direction. As the adhesive sheet 12 is stretched in the radial direction, a gap (G2) between the plurality of dies 11 is increased (see FIG. 3). Accordingly, during the cleaning process, foreign materials fitted in the gap G2 between the plurality of dies 11 may be easily and quickly removed.

The wafer processing apparatus further includes the chuck module 150 installed in the rotating chuck 120 and configured to fix the wafer 10 to the vacuum chuck 130 and fix the ring cover 140 to the rotating chuck 120.

The chuck module 150 includes a chuck base 151, a chuck rotating part 155, a plurality of first chuck links 160, a plurality of wafer confining parts 170, a plurality of second chuck links 180 and a plurality of cover confining parts 190.

The chuck base 151 is installed in the rotating chuck 120. The chuck rotating part 155 is connected to the chuck base 151 to rotate the chuck base 151. The plurality of first chuck links 160 are each radially connected to the chuck base 151 and are moved when the chuck base 151 is rotated. The plurality of wafer confining parts 170 are connected to the first chuck links 160 to fix the retainer ring 13 on the wafer 10 to the vacuum chuck 130 when the first chuck links 160 are moved. The chuck base 151 is installed to be concentric with the rotating chuck 120. The chuck base 151, the chuck rotating part 155, and the first chuck links 160 are disposed inside the rotating chuck 120, and the wafer confining parts 170 are disposed in circumferential portions of the rotating chuck 120 and the vacuum chuck 130.

When the chuck rotating part 155 is driven, since the chuck base 151 is rotated at a predetermined angle, the plurality of first chuck links 160 are moved in a radial direction of the chuck base 151. Since the plurality of first chuck links 160 are simultaneously moved, the plurality of wafer confining parts 170 press and fix the retainer ring 13 on the wafer 10 to a circumferential portion of the first vacuum chuck 131.

The chuck base 151 includes a base body 152, a plurality of guides 153, and a base gear 154.

The base body 152 is formed in an annular shape to be concentric with the rotating shaft 111 of the rotating chuck 120. The base body 152 is disposed inside the rotating chuck 120. The plurality of guides 153 are formed in the base body 152 to allow the first chuck link 160 to be movably coupled. The number of the plurality of guides 153 is twice the number of the first chuck links 160, and the plurality of guides 153 are formed at equal intervals in a circumferential direction of the base body 152. The first chuck links 160 are alternately coupled to the plurality of guides 153. The base gear 154 is formed on the base body 152 and connected to the chuck rotating part 155. The base gear 154 is disposed on an inner circumferential surface of the base body 152 in the form of an arc. As the chuck rotating part 155 is driven, the base gear 154 is rotated, and as the base body 152 is rotated together with the base gear 154, the first chuck link 160 is moved in a radial direction of the base body 152.

The guide 153 is formed to be inclined with respect to a radius of the base body 152. The guide 153 may be a guide hole. The guide 153 may be a guide groove or a guide protrusion. Since the guide 153 is formed to be inclined with respect to the radius of the base body 152, as the base body 152 is rotated at a predetermined angle, the first chuck link 160 is linearly moved in the radial direction of the base body 152.

The first chuck link 160 includes a first guide slider 161, a first link member 162, and a first link gear 163 (see FIG. 4). The first guide slider 161 is movably coupled to the guide 153. The first link member 162 is connected to the first guide slider 161 and is linearly moved in the radial direction of the base body 152 when the first guide slider 161 is moved. The first link member 162 is formed in the form of a linear bar. The first link gear 163 is formed on the first link member 162 to be moved by being engaged with the wafer confining part 170. The first link gear 163 is formed in the form of a rack gear disposed parallel to a lengthwise direction of the first link member 162.

The first chuck link 160 further includes a first guide block 164 which is coupled to allow the first link member 162 to be linearly moved. When the base body 152 is rotated, the first guide block 164 prevents the first link member 162 from being rotated in the circumferential direction of the base body 152. Accordingly, when the base body 152 is rotated and when the first guide slider 161 is moved along the guide 153, the first link member 162 may be linearly moved without being rotated.

The wafer confining part 170 includes a press gripper 175 rotated to press or release the retainer ring 13 on the wafer 10 when a gripper link 173 is moved. The press gripper 175 is formed in an arc shape to press and fix the retainer ring 13 on the wafer 10 in the circumferential direction.

The plurality of second chuck links 180 are each radially connected to the chuck base 151 and are moved when the chuck base 151 is rotated. The plurality of cover confining parts 190 are connected to the second chuck links 180 to fix the ring cover 140 to the rotating chuck 120 when the second chuck links 180 are moved. As the chuck rotating part 155 is driven, the base gear 154 is rotated, and as the base body 152 is rotated together with the base gear 154, the second chuck link 180 is moved in the radial direction of the base body 152. In this case, when the base body 152 of the chuck base 151 is rotated, the plurality of first chuck links 160 and the plurality of second chuck links 180 are moved simultaneously. As the first chuck link 160 is moved, the retainer ring 13 on the wafer 10 is fixed to the vacuum chuck 130, and as the second chuck link 180 is moved, the ring cover 140 is fixed to the rotating chuck 120. Therefore, since the wafer 10 and the ring cover 140 are simultaneously fixed to the vacuum chuck 130 and the rotating chuck 120 using one chuck base 151 and one chuck rotating part 155, a structure of the wafer processing apparatus can be simplified.

The second chuck link 180 includes a second guide slider 181 and a second link member 182.

The second guide slider 181 is movably coupled to the guide 153. The second link member 182 is connected to the second guide slider 181 and is linearly moved in the radial direction of the base body 152 when the second guide slider 181 is moved. A second link gear is formed on the second link member 182 to be moved by being engaged with the cover confining part 190. The second link member 182 is formed in the form of a linear bar. The second link gear is formed in the form of a rack gear disposed parallel to a lengthwise direction of the second link member 182.

The second chuck link 180 further includes a second guide block 184 which is coupled to allow the second link member 182 to be linearly moved. When the base body 152 is rotated, the second guide block 184 prevents the second chuck link 180 from being rotated in the circumferential direction of the base body 152. Accordingly, when the base body 152 is rotated and when the second guide slider 181 is moved along the guide 153, the second link member 182 may be linearly moved without being rotated.

The cover confining parts 190 are connected to the second chuck links 180 to fix the confining bump 142 of the ring cover 140 to the rotating chuck 120 when the second chuck links 180 are moved.

Figure 6:
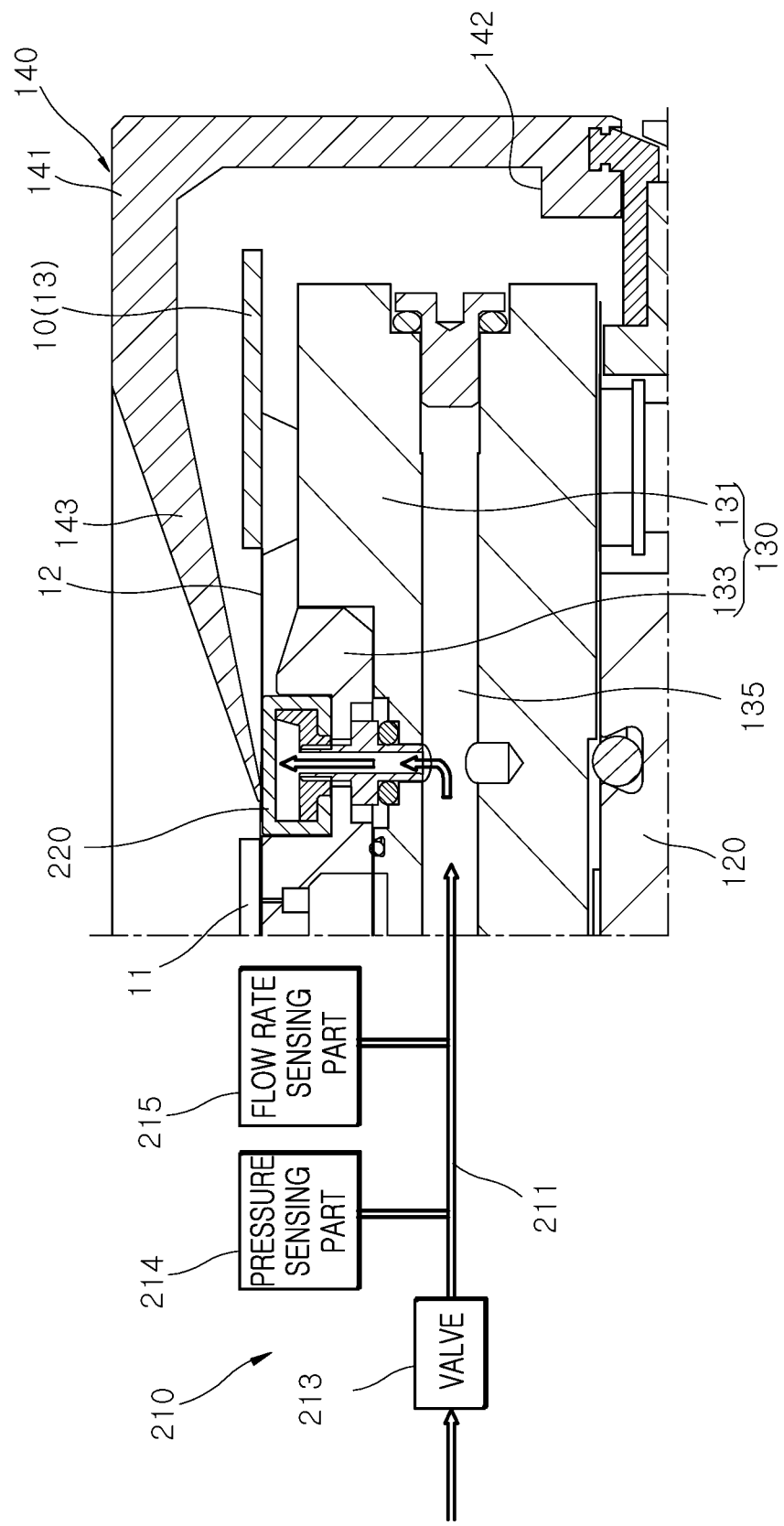
FIG. 6 is a schematic cross-sectional view illustrating a state in which a medium supply part supplies an inspection medium to the vacuum chuck in the wafer processing apparatus according to one embodiment of the present invention.
Figure 7:
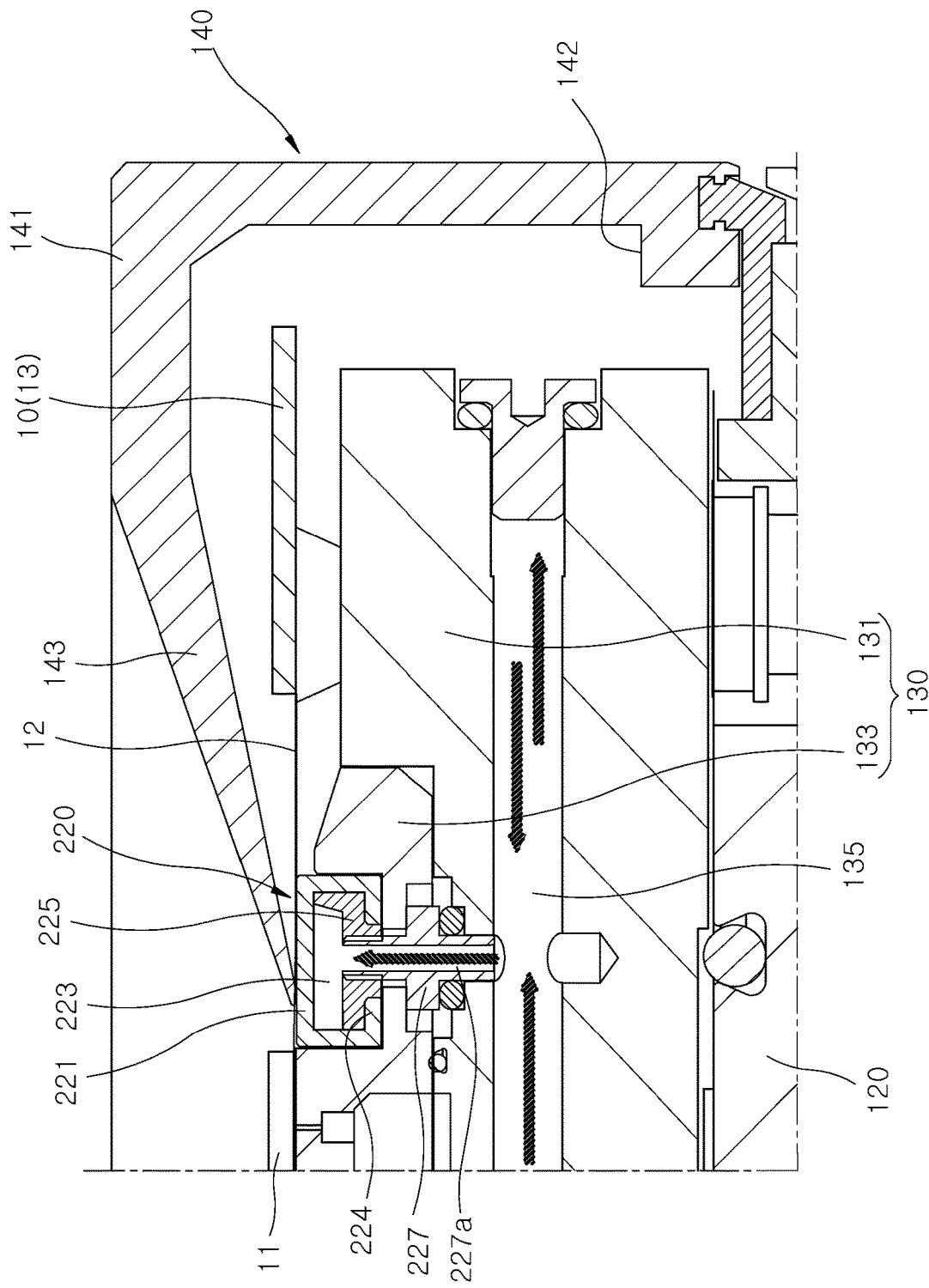
FIG. 7 is a schematic cross-sectional view illustrating a state in which the inspection medium supplied to the vacuum chuck is supplied to a sealing ring in the wafer processing apparatus according to one embodiment of the present invention.

FIG. 6 is a schematic cross-sectional view illustrating a state in which a medium supply part supplies an inspection medium to the vacuum chuck in the wafer processing apparatus according to one embodiment of the present invention, and FIG. 7 is a schematic cross-sectional view illustrating a state in which the inspection medium supplied to the vacuum chuck is supplied to a sealing ring in the wafer processing apparatus according to one embodiment of the present invention.

Referring to FIGS. 6 and 7, the medium supply part 210 is connected to the vacuum chuck 130 to supply an inspection medium to the vacuum chuck 130. In this case, the vacuum chuck 130 includes the vacuum chamber 135 configured to supply the inspection medium, which is supplied to the vacuum chuck 130, to the sealing ring 220. The vacuum chamber 135 may be radially formed in the first vacuum chuck 131 to be connected to each of a plurality of sealing rings 220.

The medium supply part 210 includes a medium supply pipe 211 connected to the vacuum chamber 135, and a valve 213 installed in the medium supply pipe 211 to open or close a flow path of the medium supply pipe 211. According to opening of the valve 213, an inspection medium flows along the medium supply pipe 211 to be supplied to the vacuum chamber 135.

The medium supply part 210 further includes a pressure sensing part 214 installed on the medium supply pipe 211 to measure a pressure of the medium supply pipe 211, and a flow rate sensing part 215 installed on the medium supply pipe 211 to measure a flow rate of the inspection medium flowing in the medium supply pipe 211. When the pressure of the medium supply pipe 211 is lower than a preset pressure while the inspection medium is being supplied to the medium supply pipe 211, it may be determined that the sealing ring 220 is damaged. In addition, the flow rate sensing part 215 detects a flow rate of the inspection medium to allow a predetermined amount of the inspection medium to be supplied to the sealing ring 220 so that it is possible to prevent an internal pressure of the sealing ring 220 from being excessively increased.

The inspection medium may include a fluorescent material. Therefore, since the inspection medium leaking from the sealing ring 220 may be checked even in a dark place, it is possible to easily check whether the sealing ring 220 is damaged even in the dark place.

The sealing ring 220 is installed in the vacuum chuck 130 to support the wafer 10, and the inspection medium supplied to the vacuum chuck 130 is introduced into the sealing ring 220. When the sealing ring 220 is damaged, since the inspection medium leaks out through the damaged portion of the sealing ring 220, it is possible to check that the inspection medium leaks from the sealing ring 220 using a leak tester (not shown). The checking of whether the sealing ring 220 is damaged may be performed before a treatment process of the wafer processing apparatus is performed. As described above, it is possible to quickly and easily check whether the sealing ring 220 is damaged or contaminated by checking whether the inspection medium leaks. Therefore, since a replacement time of the sealing ring 220 can be accurately recognized, a maintenance cost of the wafer processing apparatus can be reduced. In addition, it is possible to prevent the wafer processing apparatus from being contaminated or damaged due to breakage of the sealing ring 220.

The sealing ring 220 includes a sealing member 221, a confining ring 225, and a connector 227. The sealing member 221 is accommodated in a sealing groove of the vacuum chuck 130, and a deformation space 223 is formed inside the sealing member 221. The confining ring 225 is installed in the sealing groove to fix the sealing member 221. The connector 227 is connected to the deformation space 223 to supply an inspection medium to the deformation space 223. The sealing member 221 may be formed in a quadrangular shape of which a lower side is open. The lower side of the sealing member 221 is fitted in the confining ring 225 to be confined. A communication channel 227a is formed in the connector 227 to communicate the deformation space 223 with the vacuum chamber 135. The inspection medium, which is supplied to the vacuum chamber 135, is supplied to the deformation space 223 of the sealing member 221 through the connector 227. Therefore, by detecting whether the inspection medium leaks from the sealing member 221, it is possible to accurately check the replacement time of the sealing member 221.

Various examples of the sealing member 221 will be described below.

FIGS. 8 to 18 are schematic cross-sectional views illustrating examples of the sealing ring in the wafer processing apparatus according to one embodiment of the present invention.

Figure 8:
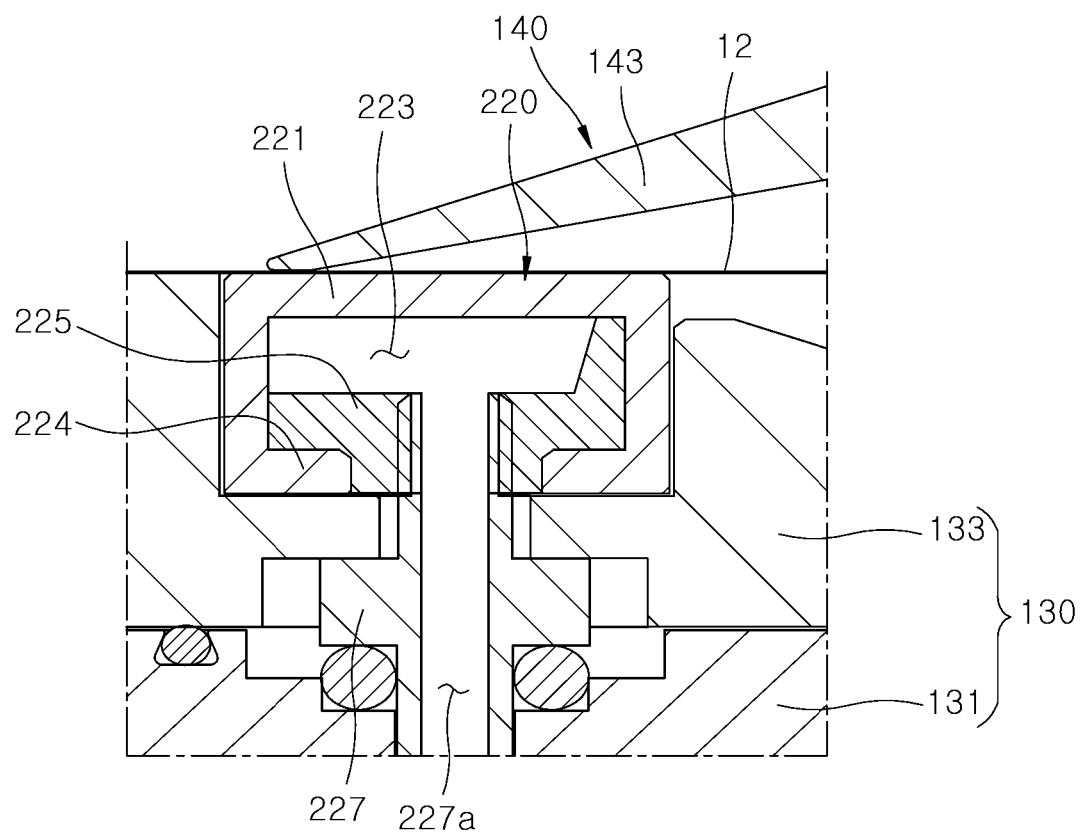
FIGS. 8 to 18 are schematic cross-sectional views illustrating examples of the sealing ring in the wafer processing apparatus according to one embodiment of the present invention.

Referring to FIG. 8, the sealing member 221 includes a sealing body 222 which is accommodated in the sealing groove and in which the deformation space 223 is formed, and fixing ribs 224 extending inward from the sealing body 222 to be fitted in the confining ring 225. The sealing body 222 is formed in substantially a "U" shape, and the fixing ribs 224 extend inward from end portions of both sides of the sealing body 222. Since the fixing rib 224 is fitted in the confining ring 225 to be confined, even when a pressure in the deformation space 223 is increased, it is possible to prevent the sealing member 221 from being separated from the confining ring 225.

The sealing member 221 detects the pressure and the flow rate of the medium supply pipe 211 to allow whether the sealing member 221 is damaged and whether the inspection medium in the sealing ring 220 is introduced to be checked. Therefore, it is possible to check whether the sealing ring 220 is damaged or contaminated in advance.

Figure 9:
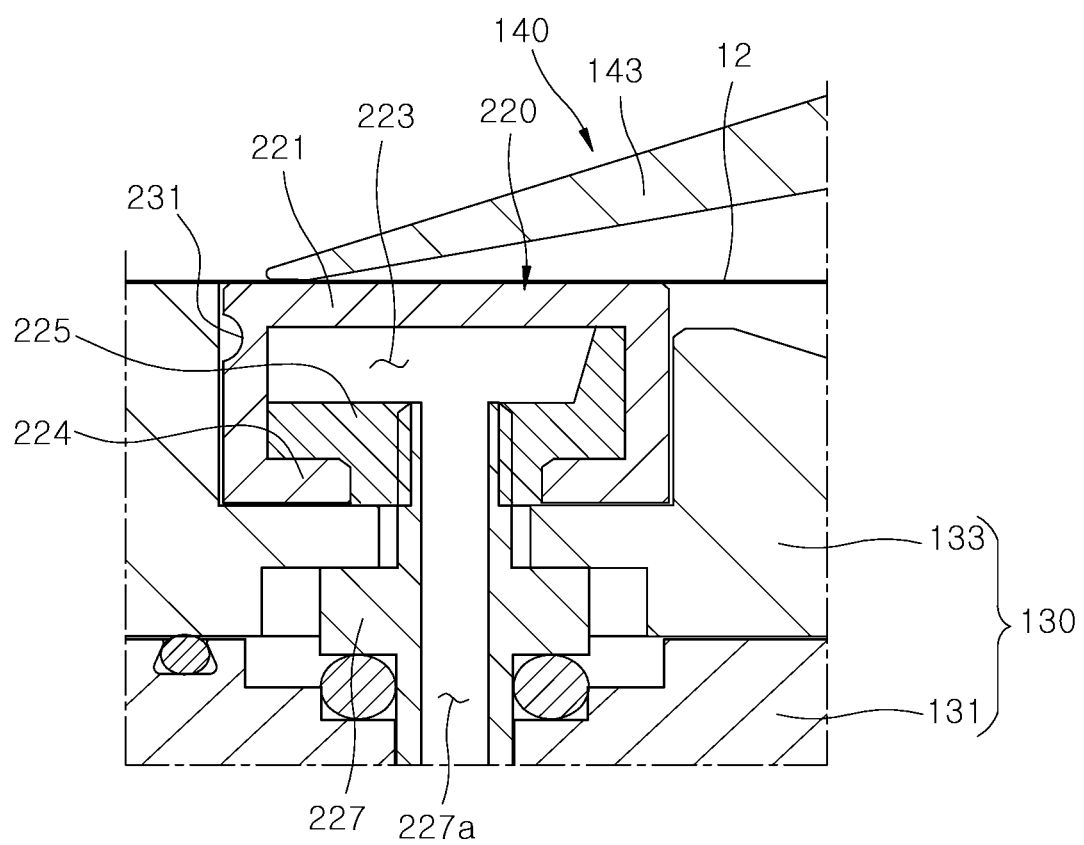
Figure 10:
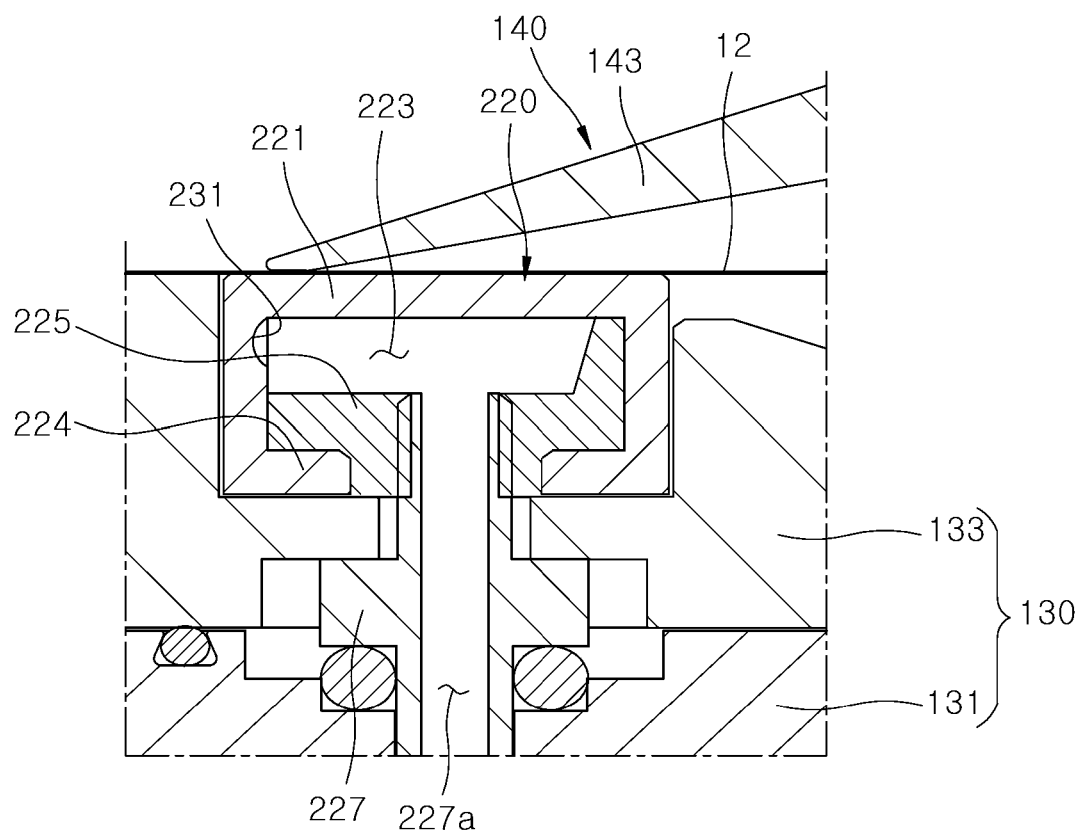
Figure 11:
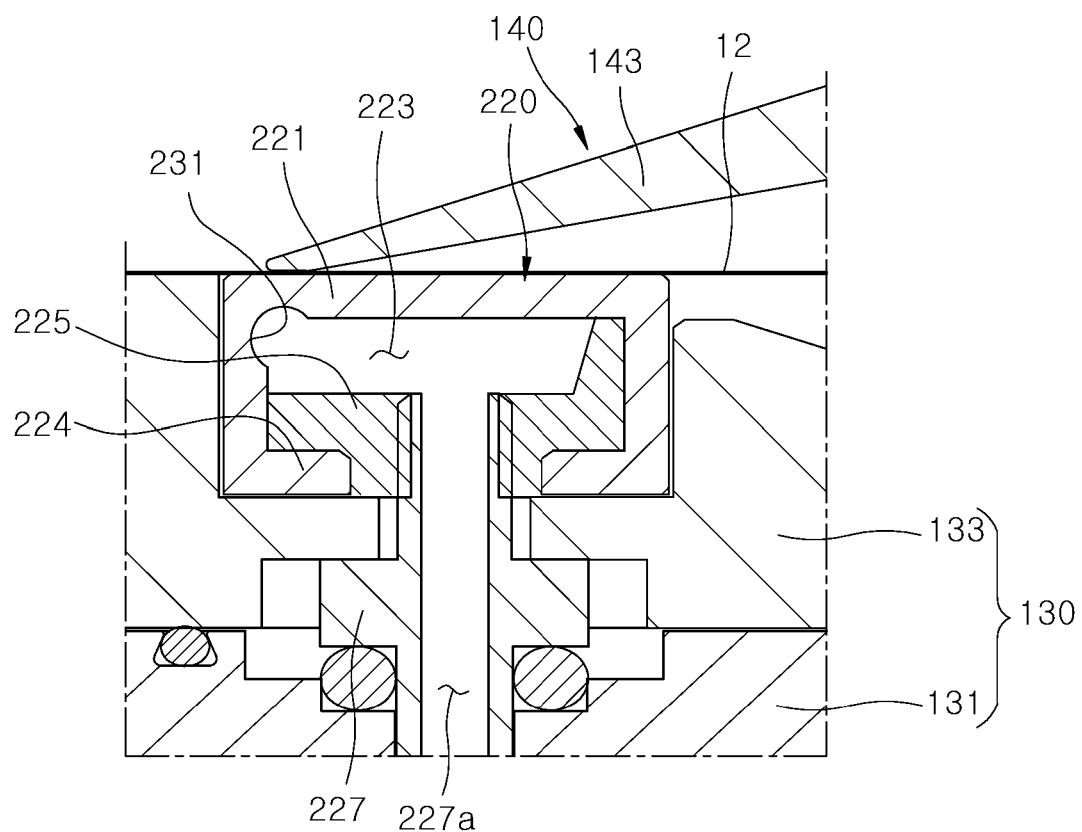

Referring to FIGS. 9 to 11, the sealing body 222 includes an elastic groove 231 formed in an outer or inner surface of the sealing body 222. The elastic groove 231 is formed in an upper corner of the sealing body 222 or formed in the vicinity of the upper corner thereof. The elastic groove 231 is formed in a circular shape in a circumferential direction of the sealing body 222. When the cover pressing part 143 of the ring cover 140 presses the sealing body 222, the sealing body 222 may be deformed more smoothly. In addition, since a deformation amount of the sealing body 222 is increased, the adhesive sheet 12 on the wafer 10 may be sealed more tightly due to a restoring force of the sealing body 222. In addition, since an adhesion area between the sealing body 222 and the cover pressing part 143 is increased, sealing performance of the sealing body 222 can be improved.

Figure 12:
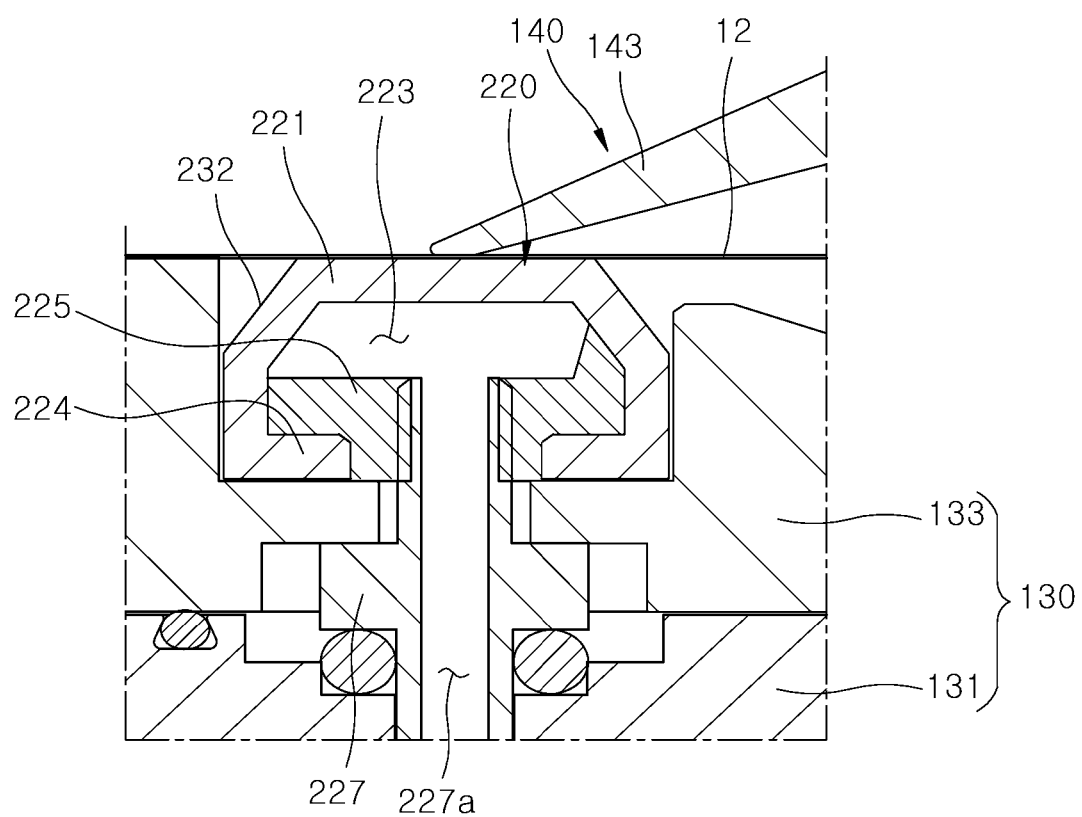

Referring to FIG. 12, the sealing body 222 includes a tapered portion 232 formed on both sides or one side of the sealing body 222 in a width direction. The tapered portion 232 is formed to be inclined downward toward the both sides of the sealing body 222. Therefore, since an upper side of the sealing body 222 is deformed more smoothly, the adhesive sheet 12 on the wafer 10 may be sealed more tightly due to the restoring force of the sealing body 222. In addition, since the adhesion area between the sealing body 222 and the cover pressing part 143 is increased, the sealing performance of the sealing body 222 can be improved.

Figure 13:
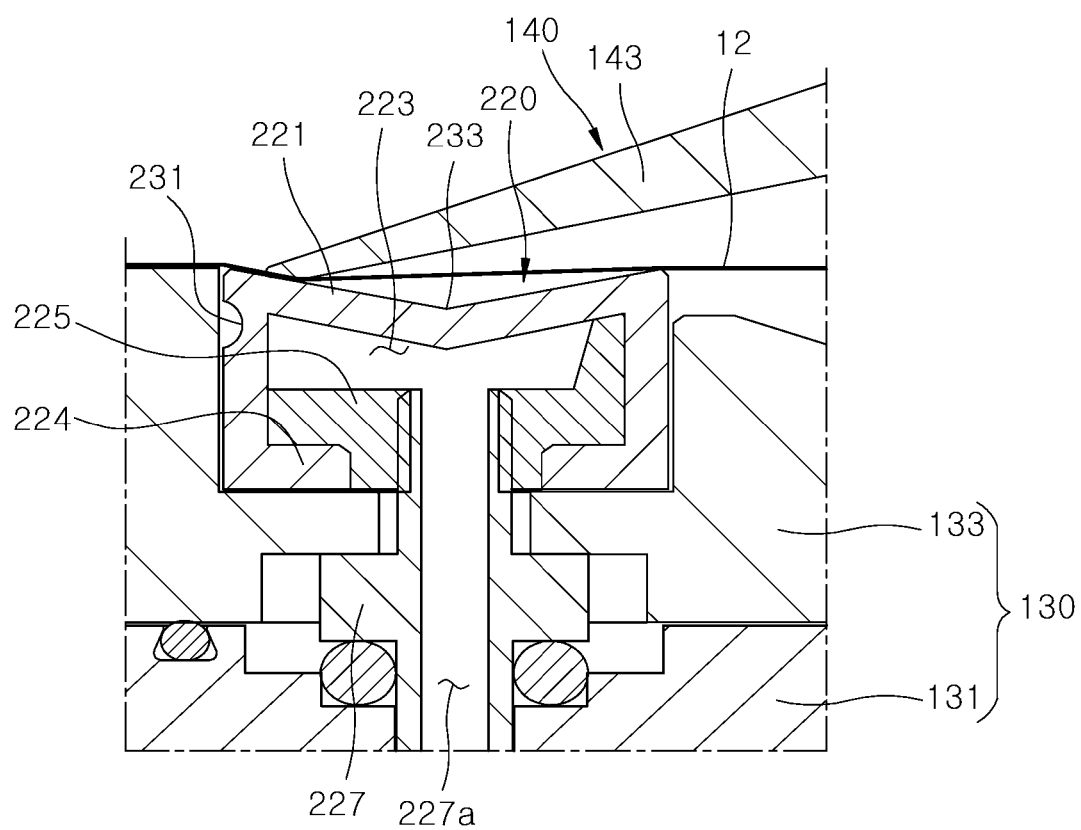
Figure 14:
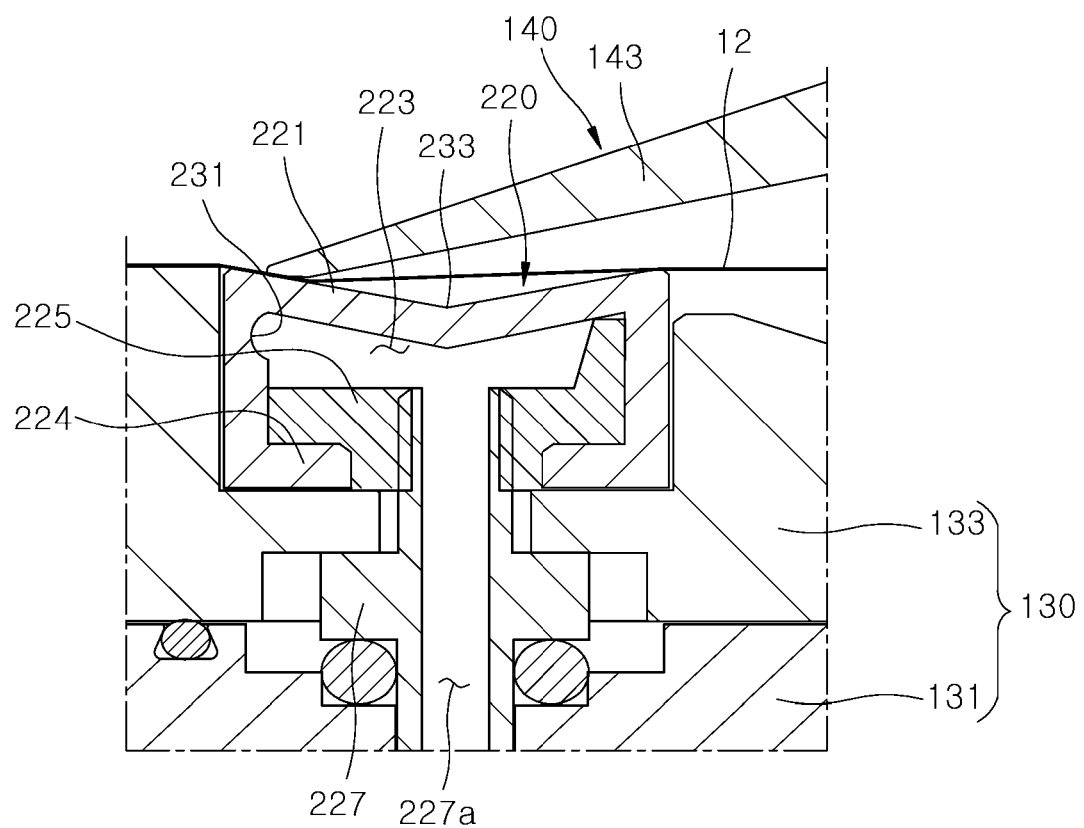

Referring to FIGS. 13 and 14, the sealing body 222 includes a concave portion 233 concavely formed on the upper side of the sealing body 222. The concave portion 233 is formed such that a central portion of the sealing body 222 in the width direction is formed to be concave downward. The concave portion 233 may be formed to be tapered toward the central portion in the width direction or be formed in a round shape. The concave portion 233 is formed in a circular shape in the circumferential direction of the sealing body 222. Since the concave portion 233 is formed on the upper side of the sealing body 222, when the cover pressing part 143 of the ring cover 140 presses the sealing body 222, the deformation amount of the sealing body 222 can be increased. In addition, since the adhesion area between the sealing body 222 and the cover pressing part 143 is increased, the sealing performance of the sealing body 222 can be improved.

The sealing body 222 may further include the elastic groove 231 formed on an outer or inner surface of the sealing body 222. The elastic groove 231 is formed in an upper corner of the sealing body 222 or formed in the vicinity of the upper corner thereof. The elastic groove 231 is formed in a circular shape in a circumferential direction of the sealing body 222. Since both of the concave portion 233 and the elastic groove 231 are formed in the sealing body 222, the deformation amount of the sealing body 222 can be further increased.

Figure 15:
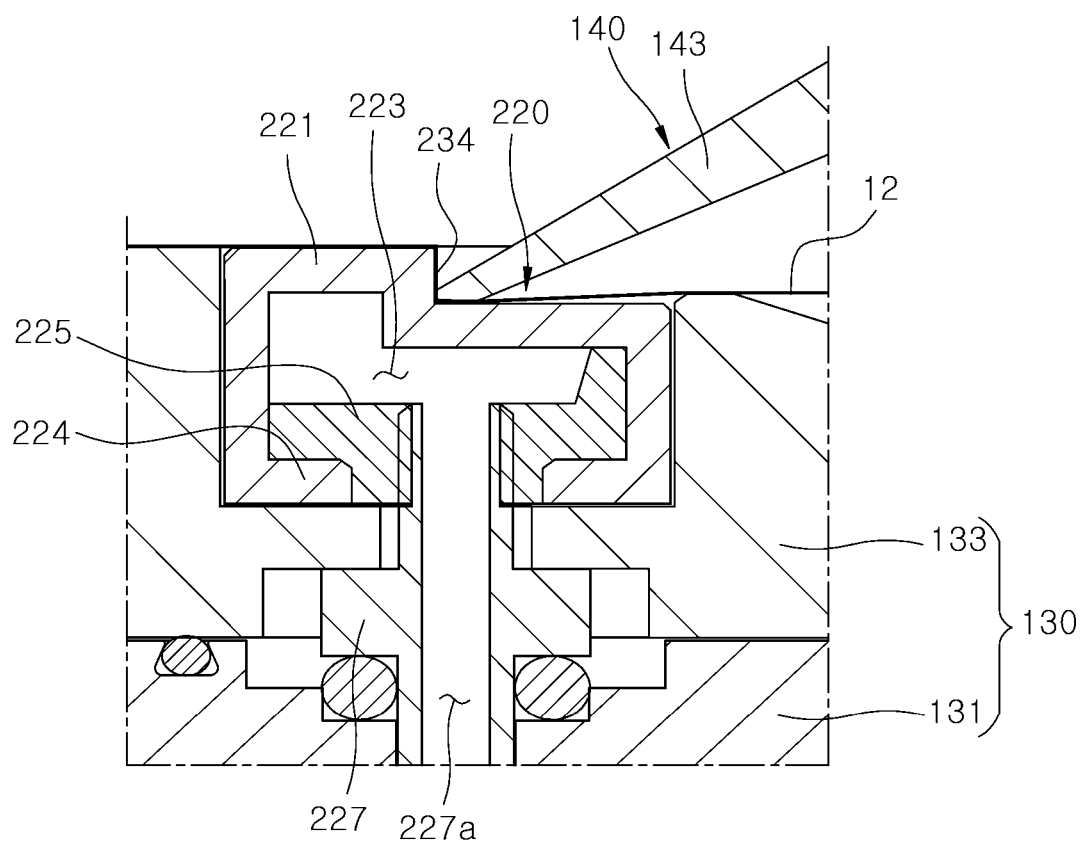

Referring to FIG. 15, the sealing body 222 includes a stepped portion 234 formed on the upper side of the sealing body 222. The stepped portion 234 may be formed in a portion in contact with an end portion of the cover pressing part 143. The stepped portion 234 is formed in a circular shape in the circumferential direction of the sealing body 222. Since the stepped portion 234 is formed on the upper side of the sealing body 222, the deformation amount of the sealing body 222 can be further increased. In addition, since the adhesion area between the sealing body 222 and the cover pressing part 143 is increased, the sealing performance of the sealing body 222 can be improved.

Figure 16:
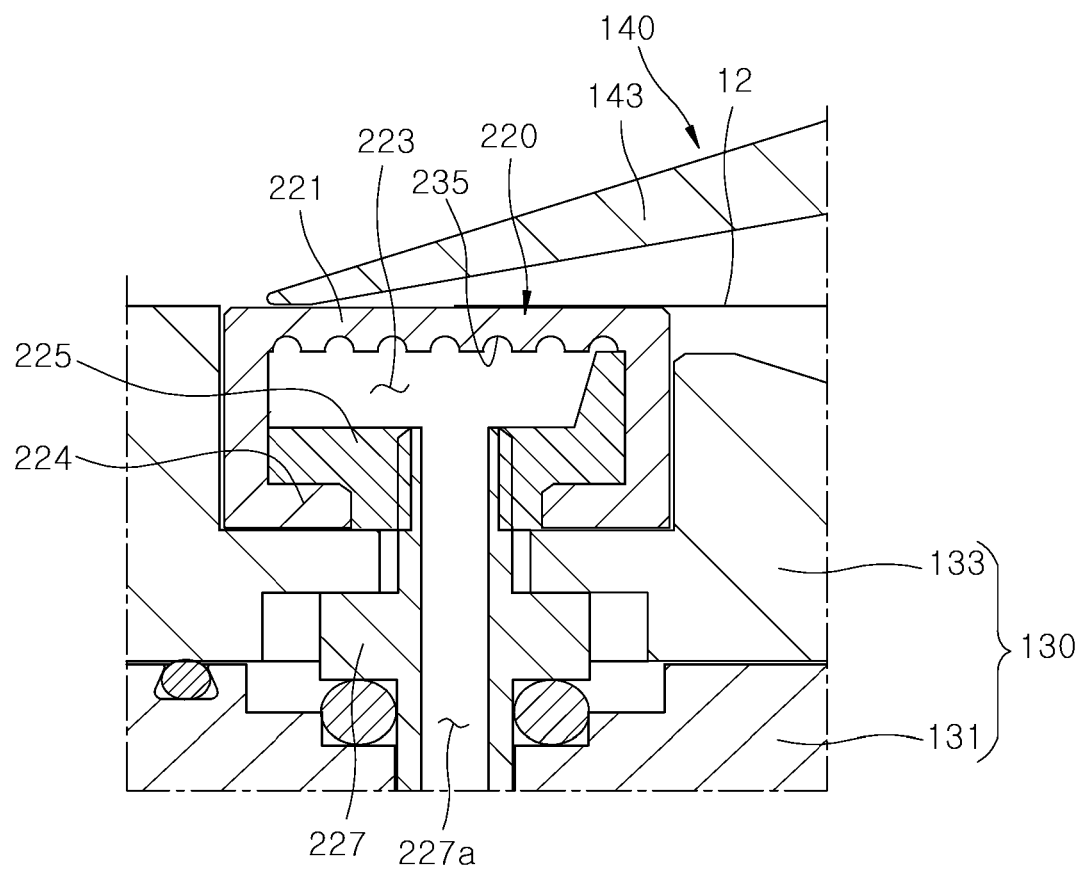

Referring to FIG. 16, the sealing body 222 includes a plurality of deformed grooves 235 formed in the upper side of the sealing body 222. The plurality of deformed grooves 235 are formed in an inner surface of the upper side of the sealing body 222. The plurality of deformed grooves 235 are each formed in a circular shape in the circumferential direction of the sealing body 222. Since the plurality of deformed grooves 235 are formed in the upper side of the sealing body 222, the deformation amount of the sealing body 222 can be further increased. In addition, since the adhesion area between the sealing body 222 and the cover pressing part 143 is increased, the sealing performance of the sealing body 222 can be improved.

Figure 17:
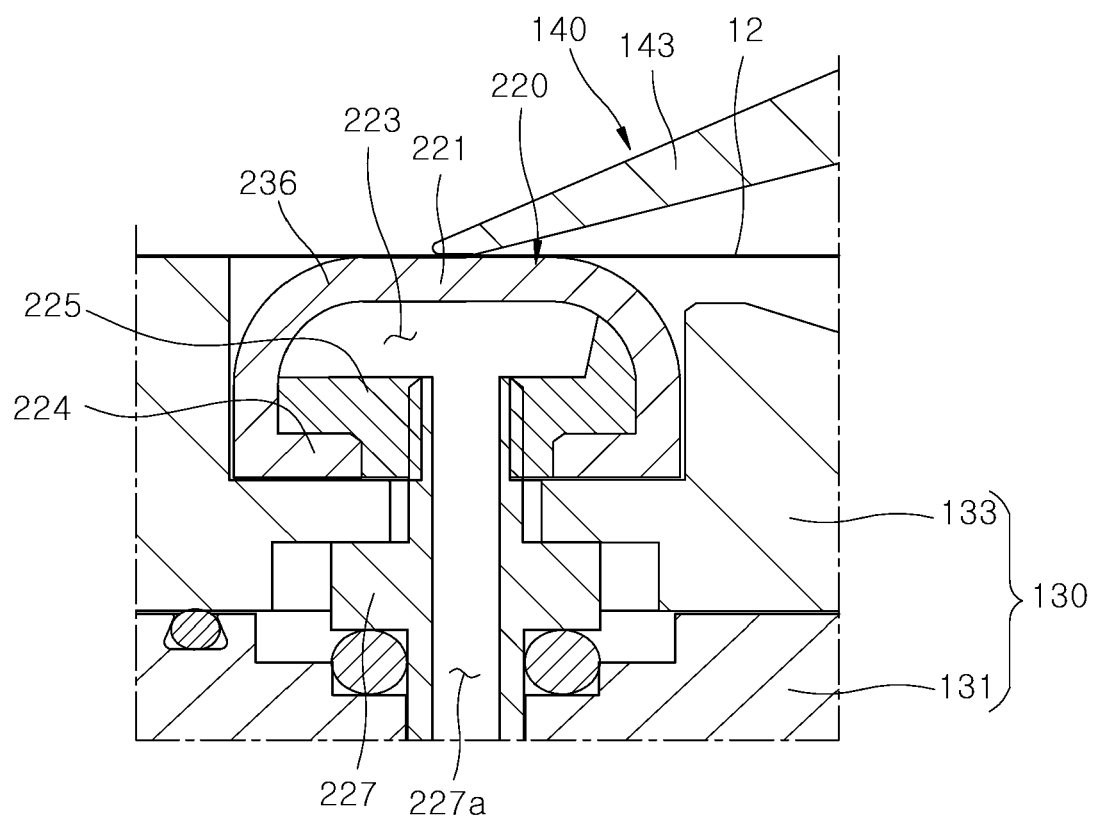

Referring to FIG. 17, the sealing body 222 includes a round portion 236 formed to be round on both sides or one side of the sealing body 222 in the width direction. The round portion 236 is formed on a corner of the sealing body 222. The round portion 236 is formed in a circular shape in the circumferential direction of the sealing body 222. Since the round portion 236 is formed on both sides of the sealing body 222, the deformation amount of the sealing body 222 can be further increased. In addition, since the adhesion area between the sealing body 222 and the cover pressing part 143 is increased, the sealing performance of the sealing body 222 can be improved.

Figure 18:
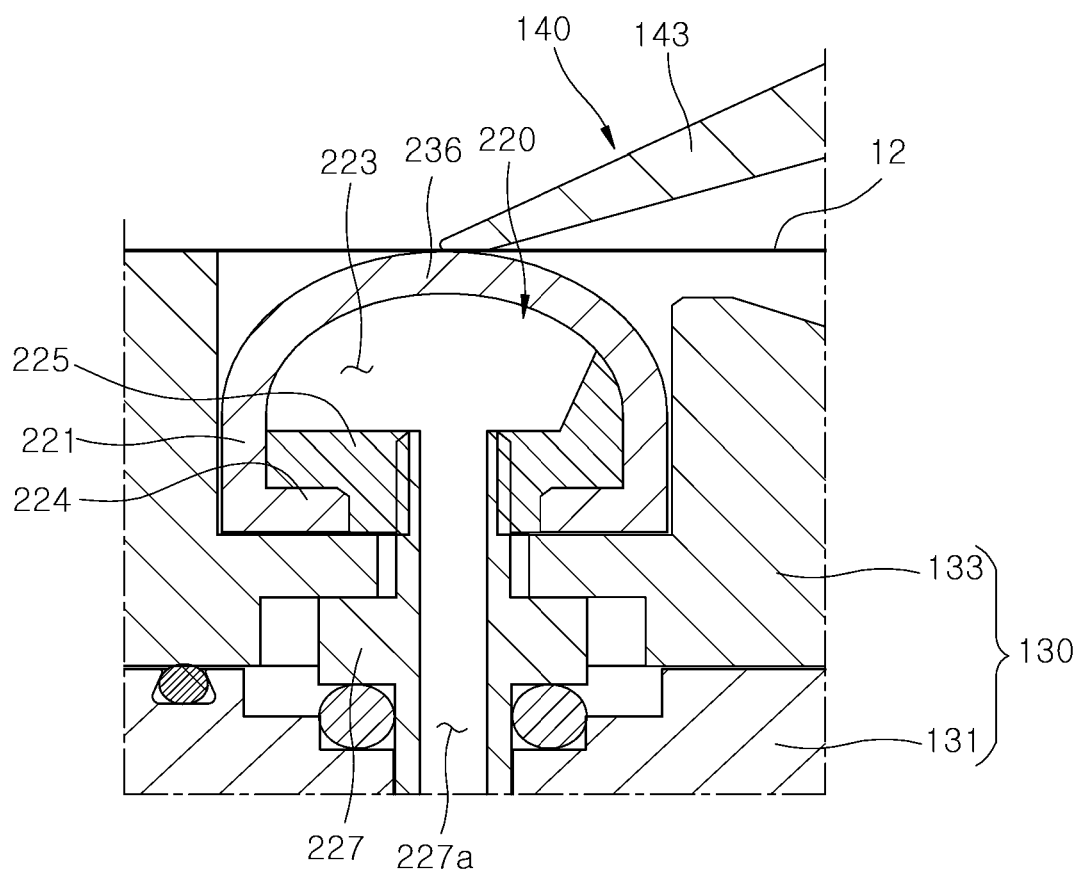

Referring to FIG. 18, the sealing body 222 includes a convex portion 237 formed on the upper side of the sealing body 222. The convex portion 237 is formed in a curved shape in the width direction of the sealing body 222. The convex portion 237 is formed in a circular shape in the circumferential direction of the sealing body 222. Since the convex portion 237 is formed on the upper side of the sealing body 222, the deformation amount of the sealing body 222 can be further increased.

A control method of a wafer processing apparatus according to one embodiment of the present invention, which is configured as described above, will be described.

Figure 19:
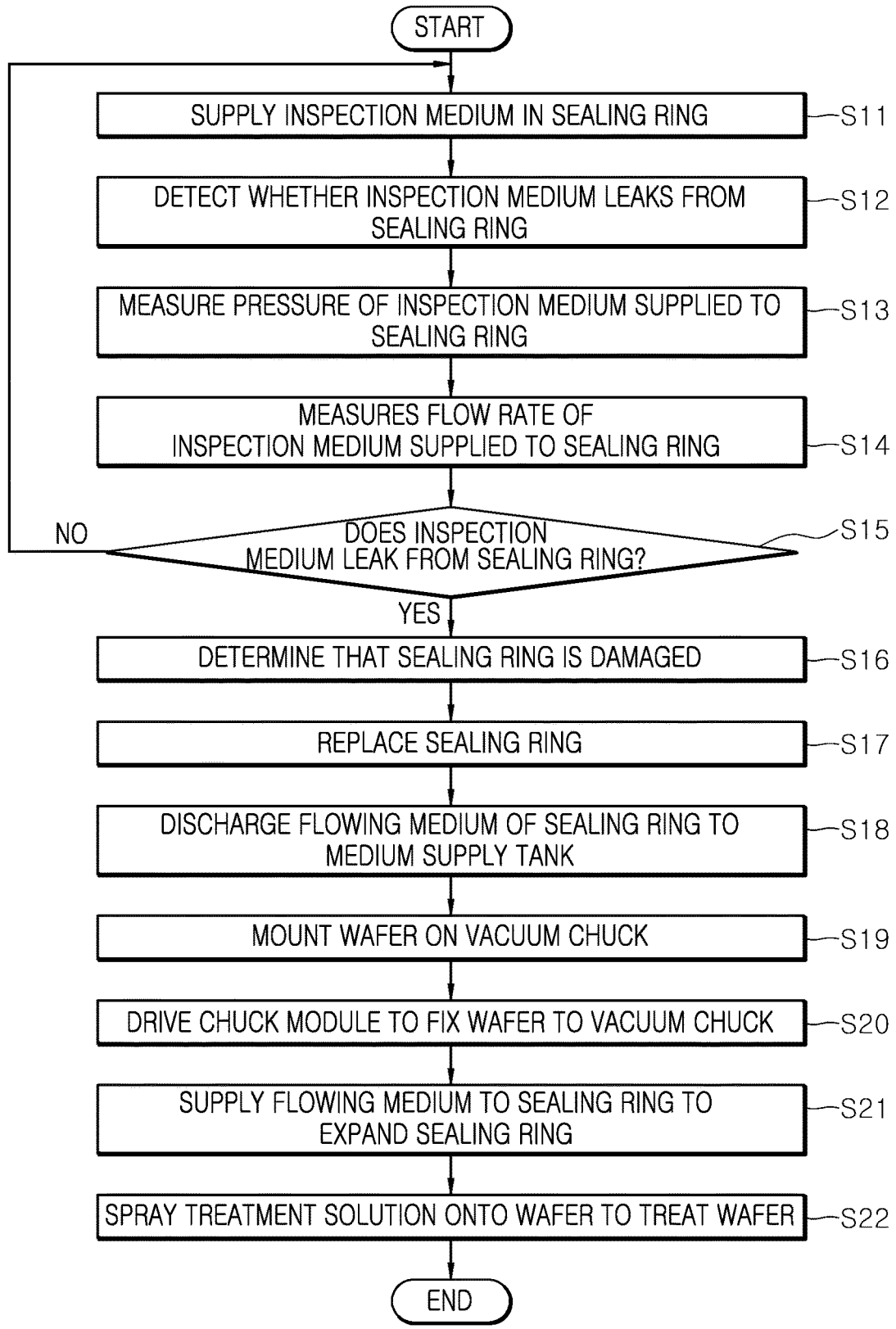
FIG. 19 is a schematic flowchart illustrating a control method of a wafer processing apparatus according to one embodiment of the present invention.

FIG. 19 is a schematic flowchart illustrating a control method of a wafer processing apparatus according to one embodiment of the present invention.

Referring to FIG. 19, before a treatment process of the wafer processing apparatus starts or after the treatment process is completed, it is possible to inspect whether the sealing ring 220 is damaged.

As the medium supply part 210 is driven, an inspection medium is supplied to the sealing ring 220 (S11). In this case, according to opening of the valve 213, the inspection medium flows along the medium supply pipe 211 to be supplied to the vacuum chamber 135. The inspection medium of the vacuum chamber 135 is supplied to the deformation space 223 of the sealing member 221 through the connector 227.

Whether the inspection medium leaks from the sealing ring 220 is detected (S12). When the sealing ring 220 is damaged, the inspection medium leaks through the damaged portion of the sealing ring 220.

The pressure sensing part 214 measures a pressure of the inspection medium supplied to the sealing ring 220 (S13). When the pressure of the medium supply pipe 211 is lower than a preset pressure while the inspection medium is being supplied to the medium supply pipe 211, a controller may determine that the sealing ring 220 is damaged.

The flow rate sensing part 215 measures a flow rate of the inspection medium supplied to the sealing ring 220 (S14). In this case, the flow rate sensing part 215 detects a flow rate of the inspection medium to allow a predetermined amount of the inspection medium to be supplied to the sealing ring 220 so that it is possible to prevent an internal pressure of the sealing ring 220 from being excessively increased. When a predetermined flow rate is detected, the flow rate sensing part 215 may close the valve 213 or adjust an opening degree of the valve 213 to be decreased.

Whether the inspection medium leaks from the sealing ring 220 is detected (S15). When the inspection medium leaks from the sealing ring 220, it is determined that the sealing ring 220 is damaged (S16). When the inspection medium contains a fluorescent material, it is easy to check whether the sealing ring 220 is damaged by looking at the leaked fluorescent material, even in a dark place. In addition, it is also possible to check whether the sealing ring 220 is damaged using a separate leak tester.

When the leakage of the inspection medium is detected, the sealing ring 220 is replaced (S17). In this case, the damaged sealing ring 220 is removed from the sealing groove, and a new sealing ring 220 is installed in the sealing groove.

A flowing medium of the sealing ring 220 is discharged (S18). In this case, the sealing body 222 is pressed inward the sealing groove and contracted, and the fixing ribs 224 of the sealing ring 220 are deformed and tightly fitted in the confining ring 225. Therefore, assembly precision of the sealing ring 220 can be improved.

A transfer part (not shown) picks up the wafer 10 and mounts the wafer 10 on the vacuum chuck 130 (S19). In this case, the retainer ring 13 on the wafer 10 is seated on a circumferential portion of the rotating chuck 120, and a portion of the adhesive sheet 12 between the retainer ring 13 and the die 11 is seated above the sealing ring 220.

The chuck module 150 is driven to fix the wafer 10 to the vacuum chuck 130 (S20). As the chuck base 151 is rotated by the chuck rotating part 155, the plurality of first chuck links 160 and the plurality of second chuck links 180 are moved simultaneously. As the first chuck link 160 is moved, the retainer ring 13 on the wafer 10 is fixed to the vacuum chuck 130, and as the second chuck link 180 is moved, the ring cover 140 is fixed to the rotating chuck 120.

The flowing medium is supplied to the sealing ring 220 to expand the sealing ring 220 (S21). As the sealing ring 220 is expanded, a sealing force is further increased due to an expansion force of the sealing ring 220 and a pressing force of the ring cover 140. Accordingly, the sealing performance of the sealing ring 220 and the ring cover 140 can be further improved.

A treatment solution is sprayed onto the wafer 10 to treat the wafer 10 (S22). In this case, a treatment solution spray nozzle (not shown) sprays the treatment solution above the wafer 10.

After the treatment process of the wafer 10 is completed, the chuck module 150 is driven to release the confinement of the wafer 10. The transfer part picks up the wafer 10 and then unloads the wafer 10 to the outside of the vacuum chuck 130.

In accordance with the present invention, since a medium supply part supplies an inspection medium to a sealing ring and whether the inspection medium leaks from the sealing ring can be checked, it is possible to quickly and accurately recognize whether the sealing ring is damaged. Therefore, it is possible to reduce a maintenance cost of a wafer processing apparatus and prevent a rotating chuck and a vacuum chuck from being damaged or contaminated due to infiltration of a treatment solution into the rotating chuck and the vacuum chuck.

While the present invention has been described with reference to the embodiments shown in the drawings, these embodiments are merely illustrative and it should be understood that various modifications and equivalent other embodiments can be derived by those skilled in the art on the basis of the embodiments.

Therefore, the true technical scope of the present invention should be defined by the appended claims.

What is claimed is:

1. A wafer processing apparatus comprising:
   a vacuum chuck on which a wafer is seated;
   a ring cover installed on a circumferential portion of the vacuum chuck;
   a medium supply part connected to the vacuum chuck to supply an inspection medium to the vacuum chuck; and
   a sealing ring which is installed in the vacuum chuck and into which the inspection medium supplied to the vacuum chuck is introduced, wherein
   the wafer is spaced apart from the sealing ring, and
   the sealing ring includes a deformation space, and a connector connected to the deformation space to supply the inspection medium to the deformation space.

2. The wafer processing apparatus of claim 1, wherein the vacuum chuck includes a vacuum chamber formed to supply the inspection medium, which is supplied to the vacuum chuck, to the sealing ring.

3. The wafer processing apparatus of claim 2, wherein the medium supply part includes:
   a medium supply pipe connected to the vacuum chamber; and
   a valve installed on the medium supply pipe to open or close a flow path of the medium supply pipe.

4. The wafer processing apparatus of claim 1, wherein the medium supply part includes:
   a pressure sensing part installed on a medium supply pipe to measure a pressure of the medium supply pipe; and
   a flow rate sensing part installed on the medium supply pipe to measure a flow rate of the inspection medium flowing in the medium supply pipe.

5. The wafer processing apparatus of claim 1, wherein the sealing ring further includes:
   a sealing member which is accommodated in a sealing groove of the vacuum chuck and in which the deformation space is formed;
   a confining ring installed in the sealing groove to fix the sealing member.

6. The wafer processing apparatus of claim 5, wherein the sealing member detects a pressure and a flow rate of a medium supply pipe to confirm whether the sealing member is damaged and whether the inspection medium is introduced into the sealing ring.

7. The wafer processing apparatus of claim 5, wherein the sealing member includes:
   a sealing body which is accommodated in the sealing groove and in which the deformation space is formed; and
   a fixing rib extending inward from the sealing body to be fitted in the confining ring.

8. The wafer processing apparatus of claim 7, wherein the sealing body includes an elastic groove formed in an outer or inner surface of the sealing body.

9. The wafer processing apparatus of claim 7, wherein the sealing body includes a tapered portion formed on both sides or one side of the sealing body in a width direction thereof.

10. The wafer processing apparatus of claim 7, wherein the sealing body includes a concave portion which is concavely formed in an upper side of the sealing body.

11. The wafer processing apparatus of claim 7, wherein the sealing body includes a stepped portion formed on an upper side of the sealing body.

12. The wafer processing apparatus of claim 7, wherein the sealing body includes a plurality of deformed grooves formed in an upper side of the sealing body.

13. The wafer processing apparatus of claim 7, wherein the sealing body includes a round portion formed to be round on both sides or one side of the sealing body in a width direction thereof.

14. The wafer processing apparatus of claim 7, wherein the sealing body includes a convex portion formed on an upper side of the sealing body.

15. The wafer processing apparatus of claim 1, wherein the vacuum chuck includes:
   a first vacuum chuck which is installed on a rotating chuck to be rotated together therewith and in which a vacuum chamber is formed; and
   a second vacuum chuck which is mounted on the first vacuum chuck, in which the sealing ring is installed, and which is installed to be moved by a moving module.

16. The wafer processing apparatus of claim 15, further comprising a chuck module installed in the rotating chuck and configured to fix the wafer to the vacuum chuck and fix the ring cover to the rotating chuck.

17. The wafer processing apparatus of claim 16, wherein the chuck module includes:
   a chuck base installed in the rotating chuck;
   a chuck rotating part connected to the chuck base to rotate the chuck base;
   a plurality of first chuck links, each of which is radially connected to the chuck base and moved when the chuck base is rotated;
   a plurality of wafer confining parts, each of which is connected to one of the first chuck links to fix a retainer ring on the wafer to the vacuum chuck when the first chuck links are moved;
   a plurality of second chuck links radially connected to the chuck base and moved when the chuck base is rotated; and
   a plurality of cover confining parts connected to the second chuck links to fix the ring cover to the rotating chuck when the second chuck links are moved.

18. A control method of a wafer processing apparatus, comprising:
   seating a wafer on a vacuum chuck;
   installing a ring cover on a circumferential portion of the vacuum chuck;
   supplying an inspection medium to the vacuum chuck as a medium supply part is driven;
   installing a sealing ring in the vacuum chuck to support the wafer and into which the inspection medium supplied to the vacuum chuck is introduced;
   detecting whether the inspection medium leaks from the sealing ring; and
   determining whether the sealing ring is damaged by whether the inspection medium leaks, wherein
   the wafer is spaced apart from the sealing ring, and
   the sealing ring includes deformation space, and a connector connected to the deformation space to supply the inspection medium to the deformation space.

19. The control method of claim 18, wherein, in the detecting of whether the inspection medium leaks from the sealing ring, a pressure sensing part measures a pressure of the inspection medium supplied to the sealing ring.

20. The control method of claim 18, wherein, in the detecting of whether the inspection medium leaks from the sealing ring, a flow rate sensing part measures a flow rate of the inspection medium supplied to the sealing ring.

* * * * *